United States Patent
Hargreaves

(10) Patent No.: US 9,218,095 B2
(45) Date of Patent: Dec. 22, 2015

(54) NON-LINEAR FEEDBACK CAPACITANCE SENSING

(71) Applicant: Synaptics Incorporated, Santa Clara, CA (US)

(72) Inventor: Kirk Hargreaves, Sunnyvale, CA (US)

(73) Assignee: Synaptics Incorporated, San Jose, CA (US)

( * ) Notice: Subject to any disclaimer, the term of this patent is extended or adjusted under 35 U.S.C. 154(b) by 239 days.

(21) Appl. No.: 13/899,421

(22) Filed: May 21, 2013

(65) Prior Publication Data

US 2014/0347310 A1    Nov. 27, 2014

(51) Int. Cl.
| | |
|---|---|
| G06F 3/044 | (2006.01) |
| G06F 3/041 | (2006.01) |
| G06F 3/038 | (2013.01) |
| H03K 17/955 | (2006.01) |
| G02F 1/133 | (2006.01) |
| G02F 1/1333 | (2006.01) |

(52) U.S. Cl.
CPC .............. *G06F 3/044* (2013.01); *G06F 3/0416* (2013.01); *G02F 1/13338* (2013.01); *G06F 3/0383* (2013.01); *H03K 17/955* (2013.01)

(58) Field of Classification Search
CPC ... G01R 27/2605; G06F 3/044; G06F 3/0416; H03M 1/46
See application file for complete search history.

(56) References Cited

U.S. PATENT DOCUMENTS

| | | | |
|---|---|---|---|
| 4,968,946 A | 11/1990 | Maier | |
| 7,288,946 B2 | 10/2007 | Hargreaves et al. | |
| 7,449,895 B2 | 11/2008 | Ely et al. | |
| 8,258,797 B2 | 9/2012 | Shahparnia et al. | |
| 8,552,316 B2 | 10/2013 | Granig et al. | |
| 2003/0164786 A1* | 9/2003 | Wolf et al. | 341/155 |
| 2007/0046299 A1* | 3/2007 | Hargreaves et al. | 324/678 |
| 2009/0244014 A1* | 10/2009 | Hotelling et al. | 345/173 |
| 2010/0244859 A1* | 9/2010 | Cormier et al. | 324/678 |
| 2011/0273189 A1 | 11/2011 | Gerber | |
| 2012/0012001 A1* | 1/2012 | Li et al. | 95/54 |
| 2012/0049868 A1* | 3/2012 | Maharyta | 324/679 |
| 2012/0218020 A1* | 8/2012 | Erdogan et al. | 327/337 |

FOREIGN PATENT DOCUMENTS

| | | |
|---|---|---|
| WO | 9406002 A1 | 3/1994 |
| WO | 2007126731 A2 | 11/2007 |

\* cited by examiner

*Primary Examiner* — Nalini Mummalaneni
(74) *Attorney, Agent, or Firm* — Osha Liang LLP

(57) ABSTRACT

A processing system for an input device includes a comparator, a digital-to-analog converter (DAC), and a feedback path coupling the DAC to the comparator. The comparator generates a first comparison signal associated with a resulting signal and a first output signal of the DAC; and generates a second comparison signal associated with the resulting signal and a second output signal of the DAC. The processing system also includes a control module and a determination module. The control module is coupled to the DAC and to the comparator's output and modifies a rising reference value and a falling reference value based on the first comparison signal and the second comparison signal, respectively. The determination module determines positional information for an input object in a sensing region of the input device based on the rising reference value and the falling reference value.

20 Claims, 10 Drawing Sheets

NON-LINEAR FEEDBACK CAPACITANCE SENSING

FIELD OF THE INVENTION

This invention generally relates to electronic devices.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

In general, in one aspect, the invention relates to a processing system for an input device. The processing system comprises: a transmitter module configured to drive a transmitter signal onto a transmitter electrode, wherein the transmitter signal comprises a plurality of sensing cycles, and wherein each sensing cycle of the plurality of sensing cycles comprises a rising portion and a falling portion; a receiver module configured to receive a resulting signal with a receiver electrode, the receiver module comprising: a digital-to-analog converter (DAC); a comparator configured to: generate, for a rising portion of a sensing cycle of the plurality of sensing signals, a first comparison signal associated with the resulting signal and a first output signal of the DAC; and generate, for a falling portion of the sensing cycle, a second comparison signal associated with the resulting signal and a second output signal of the DAC; and a feedback path operatively coupling the DAC to the comparator and configured to maintain an input node of the comparator at a substantially constant value; and a control module operatively coupled to the DAC and to an output of the comparator and configured to modify a rising reference value based on the first comparison signal and a falling reference value based on the second comparison signal; and a determination module configured to determine positional information for an input object in a sensing region of the input device based on the rising reference value and the falling reference value.

In general, in one aspect, the invention relates to a method for operating an input device. The method comprises: driving a transmitter signal onto a transmitter sensor electrode, wherein the transmitter signal comprises a plurality of sensing cycles, and wherein each sensing cycle of the plurality of sensing cycles comprises a rising portion and a falling portion; receiving a resulting signal with a receiver sensor electrode; generating, by a comparator for the rising portion of a first sensing cycle of the plurality of sensing cycles, a first comparison signal associated with the resulting signal and a first output signal of a digital-to-analog converter (DAC), wherein the comparator is operatively connected to the DAC by a feedback path configured to maintain an input node of the comparator at a substantially constant value; generating, for the falling portion of the sensing cycle, a second comparison signal associated with the resulting signal and a second output signal of the DAC; modifying a rising reference value based on the first comparison signal; modifying a falling reference value based on the second comparison signal; and determining positional information for an input object in a sensing region of the input device based on the rising reference value and the falling reference value.

In general, in one aspect, the invention relates to an input device. The input device comprises: a plurality of transmitter electrodes; a plurality of receiver electrodes; and a processing system, the processing system coupled to the plurality of transmitter electrodes and the plurality of receiver electrodes, the processing system is configured to: drive a transmitter signal onto at least one of the plurality of transmitter electrodes, wherein the transmitter signal comprises a plurality of sensing cycles, and wherein each sensing cycle of the plurality of sensing cycles comprises a rising portion and a falling portion; receive a resulting signal with the plurality of receiver sensor electrodes; generate, by a comparator for the rising portion of a first sensing cycle, a first comparison signal associated with the resulting signal and a first output signal of a digital-to-analog converter (DAC), wherein the comparator is operatively connected to the DAC by a feedback path configured to maintain an input node of the comparator at a constant value; generate, for the falling portion of the sensing cycle, a second comparison signal associated with the resulting signal and a second output signal of the DAC; modify a rising reference value based on the first comparison signal; modify a falling reference value based on the second comparison signal; and determining positional information for an input object in a sensing region of the input device based on the rising reference value and the falling reference value.

Other aspects of the invention will be apparent from the following description and the appended claims.

BRIEF DESCRIPTION OF DRAWINGS

The preferred exemplary embodiment of the present invention will hereinafter be described in conjunction with the appended drawings, where like designations denote like elements, and.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention provide input devices and methods that facilitate improved usability.

Figure 1:
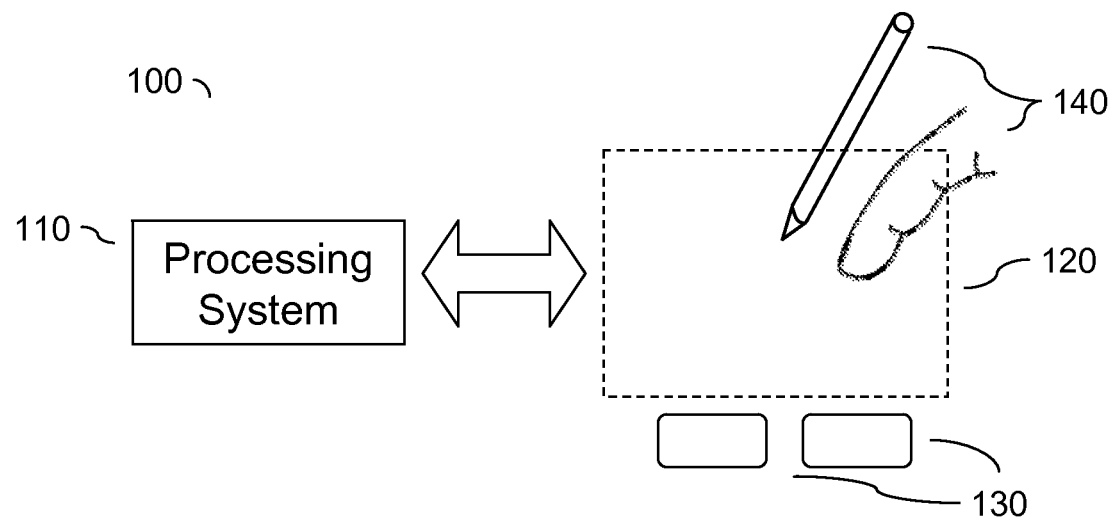
FIG. 1 is a block diagram of an exemplary input device in accordance with one or more embodiments of the invention.

Turning now to the figures, FIG. 1 is a block diagram of an exemplary input device (100), in accordance with embodiments of the invention. The input device (100) may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device (100) and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device (100) can be implemented as a physical part of the electronic system, or can be physically separate from the electronic system. As appropriate, the input device (100) may communicate with parts of the electronic system using any one or more of the following: buses, networks, and other wired or wireless interconnections. Examples include $I^2C$, SPI, PS/2, Universal Serial Bus (USB), Bluetooth, RF, and IRDA.

In FIG. 1, the input device (100) is shown as a proximity sensor device (also often referred to as a "touchpad" or a "touch sensor device") configured to sense input provided by one or more input objects (140) in a sensing region (120). Example input objects include fingers and styli, as shown in FIG. 1.

Sensing region (120) encompasses any space above, around, in and/or near the input device (100) in which the input device (100) is able to detect user input (e.g., user input provided by one or more input objects (140)). The sizes, shapes, and locations of particular sensing regions may vary widely from embodiment to embodiment. In some embodiments, the sensing region (120) extends from a surface of the input device (100) in one or more directions into space until signal-to-noise ratios prevent sufficiently accurate object detection. The distance to which this sensing region (120) extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device (100), contact with an input surface (e.g. a touch surface) of the input device (100), contact with an input surface of the input device (100) coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region (120) has a rectangular shape when projected onto an input surface of the input device (100).

The input device (100) may utilize any combination of sensor components and sensing technologies to detect user input in the sensing region (120). The input device (100) comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device (100), a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device (100), one or more sensing elements pick up loop currents induced by a resonating coil or pair of coils. Some combination of the magnitude, phase, and frequency of the currents may then be used to determine positional information.

In some capacitive implementations of the input device (100), voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes") and one or more receiver sensor electrodes (also "receiver electrodes"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

Some capacitive implementations utilize both transcapacitance and absolute capacitance sensing methods. In other words, some capacitive implementations are a hybrid of transcapacitance and absolute capacitance sensing methods based on changes in the capacitive coupling between sensor electrodes and between sensor electrodes and an input object.

In FIG. 1, a processing system (110) is shown as part of the input device (100). The processing system (110) is configured to operate the hardware of the input device (100) to detect input in the sensing region (120). The processing system (110) comprises parts of or all of one or more integrated circuits (ICs) and/or other circuitry components. For example, a processing system for a mutual capacitance sensor device may comprise transmitter circuitry/module configured to transmit signals with transmitter sensor electrodes, and/or receiver circuitry/module configured to receive signals with receiver sensor electrodes).

In some embodiments, the processing system (110) also comprises electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to sensing element(s) of input device (100), and one or more components elsewhere. For example, the input device (100) may be a peripheral coupled to a desktop computer, and the processing system (110) may comprise software configured to run on a central processing unit of the desktop computer and one or more ICs (perhaps with associated firmware) separate from the central processing unit. As another example, the input device (100) may be physically integrated in a phone, and the processing system (110) may comprise circuits and firmware that are part of a main processor of the phone. In some embodiments, the processing system (110) is dedicated to implementing the input device (100). In other embodiments, the processing system (110) also performs other functions, such as operating display screens, driving haptic actuators, etc.

The processing system (110) may be implemented as a set of modules that handle different functions of the processing system (110). Each module may comprise circuitry that is a part of the processing system (110), firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system (110) responds to user input (or lack of user input) in the sensing region (120) directly by causing one or more actions. Example actions include changing operation modes, as well as GUI actions such as cursor movement, selection, menu navigation, and other functions. In some embodiments, the processing system (110) provides information about the input (or lack of input) to some part of the electronic system (e.g. to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes. As another example, the processing system (110) may perform filtering or other signal conditioning. As yet another example, the processing system (110) may subtract or otherwise account for a baseline, such that the information reflects a difference between the electrical signals and the baseline. As yet further examples, the processing system (110) may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device (100) is implemented with additional input components that are operated by the processing system (110) or by some other processing system. These additional input components may provide redundant functionality for input in the sensing region (120), or some other functionality. FIG. 1 shows buttons (130) near the sensing region (120) that can be used to facilitate selection of items using the input device (100). Other types of additional input components include sliders, balls, wheels, switches, and the like. Conversely, in some embodiments, the input device (100) may be implemented with no other input components.

In some embodiments, the input device (100) comprises a touch screen interface, and the sensing region (120) overlaps at least part of an active area of a display screen. For example, the input device (100) may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. As another example, the display screen may be operated in part or in total by the processing system (110).

In general, embodiments of the invention provide a system and method for operating an input device. Furthermore, embodiments of the invention provide a system and method for digitally measuring changes in capacitance(s) (i.e., measuring changes in capacitance(s) using digital logic) in a sensing region due to the presence of an input object. Specifically, a transmitter signal having multiple sensing cycles is driven onto a transmitter electrode in a sensing region of the input device. Each sensing cycle has a rising portion and a falling portion. A resulting signal is received from a receiver electrode in the sensing region. The resulting signal comprises effects corresponding to the transmitter signal, input objects in the sensing region, and one or more types of interference (if any). A digital-to-analog (DAC) converter is set corresponding to a rising reference value and to a falling reference value for the rising portion and the falling portion, respectively, of each sensing cycle. A comparison signal (e.g., output of a comparator(s)) associated with the resulting signal and the output of the DAC is generated for both the rising portion and the falling portion of each sensing cycle. The rising reference value and the falling reference value are modified (e.g., decremented, incremented) based on the comparison signal(s). Differences, patterns, and trends involving the rising reference value and falling reference value are used to determine positional information of an input object proximate to the sensing region, the presence of interference, etc.

Figure 2:
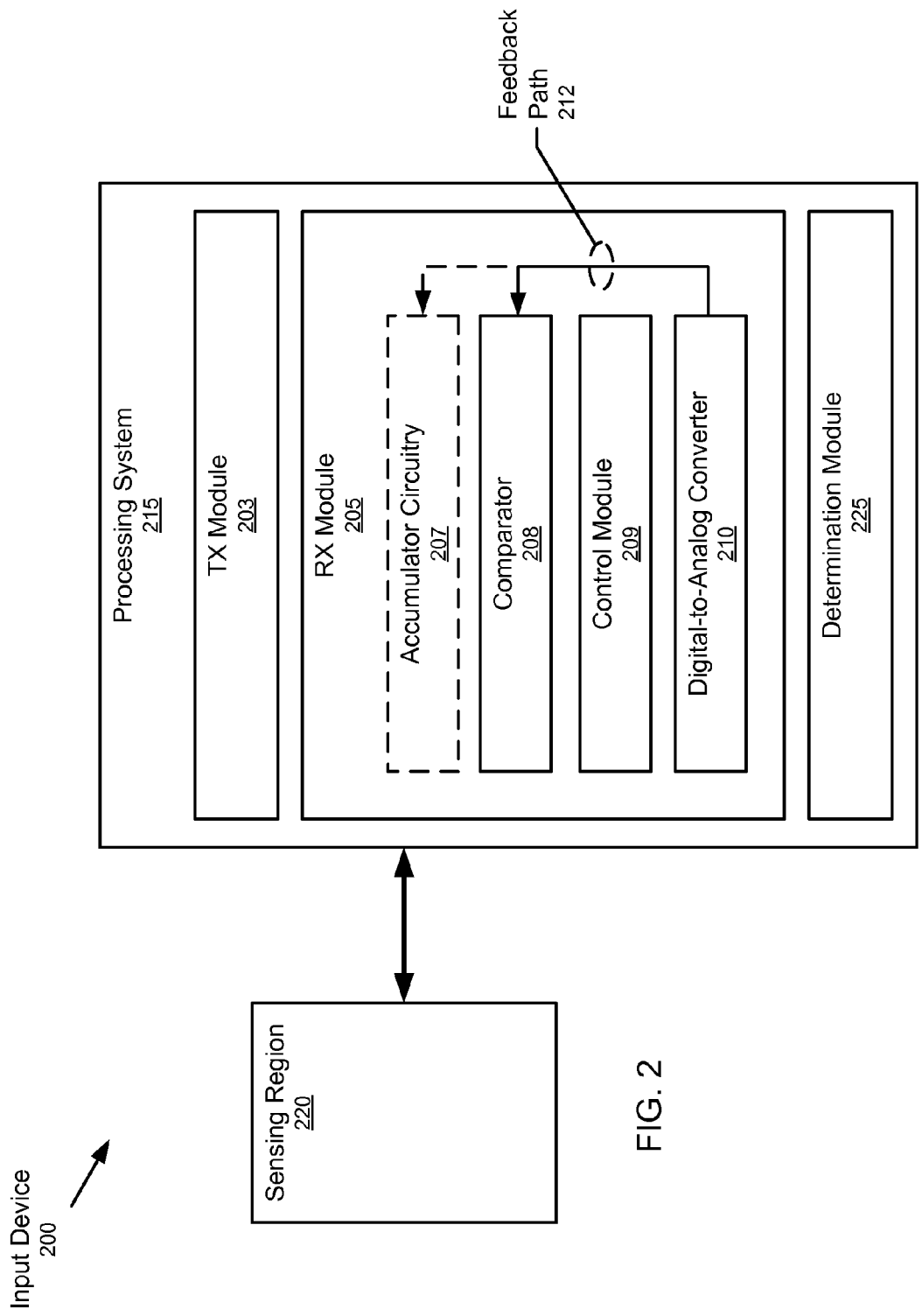
FIG. 2 is a block diagram of an input device in accordance with one or more embodiments of the invention.

FIG. 2 shows an input device (200) in accordance with one or more embodiments of the invention. As shown in FIG. 2, the input device (200) includes a sensing region (220) and a processing system (215). The sensing region (220) and the processing system (215) may be essentially the same as the sensing region (120) and the processing system (110), discussed above in reference to FIG. 1. As also shown in FIG. 2, the processing system (215) includes a transmitter module (203), a receiver module (205), and a determination module (225). The receiver module (205), one or more comparators (208), a control module (209), and a DAC (210). In one or more embodiments, the receiver module (205) optionally comprises accumulator circuitry (207). A feedback path (212) exists and effectively links the DAC (210) and the comparator (208). Each of these components (203, 205, 207, 208, 209, 210, 212, and 220) is discussed below.

In one or more embodiments, the processing system (205) includes the transmitter module (203) and the receiver module (205). The transmitter module (203) is configured to drive a transmitter signal ($V_{TX}$) onto a transmitter electrode of the sensing region (220). The transmitter signal may be a square wave, a sinusoidal wave, or any type of signal with repeating sensing cycles, where each sensing cycle of the transmitter signal includes a transition between a rising portion and a falling portion. The receiver module (203) is configured to receive a resulting signal from a receiver electrode of the sensing region (220). The resulting signal comprises effects corresponding to one or more of: (i) the transmitter signal; (ii) input objects proximate to the sensing region (220); and (iii) one or more types of interference (noise) from a variety of sources. The transmitter module (203) and the receiver module (205) may be components of the processing system (110), discussed above in reference to FIG. 1.

In one or more embodiments, the receiver module (205) of the input device (200) includes accumulator circuitry (207). The accumulator circuitry (207) is driven by an input signal composed of at least the resulting signal. Other components of the input signal may include an offset signal (discussed below) and/or a coarse signal (discussed below). In one embodiment, at approximately the start of the rising portion and the start of the falling portion of each sensing cycle, the accumulator circuitry (207) is reset (i.e., reset phase). In other embodiments, the accumulator circuitry (207) may be reset corresponding to different portions of a sensing cycle and the portion of the sensing cycle for which the accumulator circuitry (207) may be varied between sensing cycles. In one embodiment, the portions of the sensing cycles may be at half sensing cycles, quarter sensing cycles, or any other fraction of sensing cycle. Following the reset, the accumulator circuitry (207) accumulates values corresponding to the input signal (i.e., integration phase) until the next reset. Accordingly, the output ($V_{ACC}$) of the accumulator circuitry (207) at a given time may represent the charge accumulated from the input signal since the last reset. In one or more embodiments, the accumulator circuitry (207) may be implemented with an amplifier and a feedback capacitor in parallel with a reset mechanism (discussed below). In various embodiments, the reset mechanism may comprise one of a reset switch, resistor or any other circuit element that is able to reset the feedback capacitor.

In one or more embodiments, the receiver module (205) of the input device (200) includes the DAC (210). The DAC (210) is set corresponding to a rising reference value and a falling reference value for the rising portion and the falling portion, respectively, of each sensing cycle. Specifically, for the rising portion of the sensing cycle, the DAC (210) inputs a digital code (i.e., binary) corresponding to the rising reference value and outputs an analog signal corresponding to the rising reference value. Similarly, for the falling portion of the sensing cycle, the DAC (210) inputs a digital code corresponding to the falling reference value and output an analog signal corresponding to the falling reference value. In one or more embodiments, during the reset phase, the DAC (210) may be set to a first and second substantially constant voltages. In one embodiment, the first and second substantially constant voltages may comprise system ground and a voltage level other than system ground (greater than or less than system ground). In various embodiments, one or more of the substantially constant voltages may be correspond to a high voltage level. In one embodiment, the first and second substantially constant voltages may be referred to as GND and VDD.

In one or more embodiments, the comparator (208) compares two signals and switches its output to indicate which of the two signals is larger. At least one of the signals being compared is associated with the resulting signal and/or the output of the DAC. One of the signals being compared may be a fixed reference signal ($V_{REF}$). The output of the comparator (208) is referred to as a comparison signal.

In one or more embodiments, when the accumulator circuitry (207) is present, one of the signals being compared by the comparator (208) is the output ($V_{ACC}$) of the accumulator circuitry (207). The other signal being compared may be the output signal of the DAC (210) or the fixed reference signal ($V_{REF}$).

In one or more embodiments, when the accumulator circuitry (207) is not present, one of the signals being compared by the comparator (208) is an input signal composed of the resulting signal, an offset signal (discussed below), and/or a coarse signal (discussed below). The other signal being compared by the comparator (208) may be the fixed reference signal ($V_{REF}$).

In one or more embodiments, receiver module (205) includes the control module (209). The control module (209) stores the rising reference value and the falling reference value. In one embodiment, the control module (209) may use any type of data structure (e.g., array, linked-list, etc.) to store the rising reference value and the falling reference value. In other embodiments, the control module (209) may use any type of hardware (e.g., counters, registers, etc.) to store the rising reference value and the falling reference value. The control module sets the DAC (210) corresponding to the rising reference value and the falling reference value during the rising portion and the falling portion, respectively, of each sensing cycle.

In one or more embodiments, during the rising portion of each sensing cycle, the control module (209) modifies (e.g., decrements, increments) the rising reference value based on the comparison signal from the comparator (208). For example, in one embodiment, if the comparison signal from the comparator (208) indicates that the signal associated with the resulting signal exceeds the reference value ($V_{REF}$), the control module (208) may increment the rising reference value by a fixed amount/interval (e.g., +1, +5, +10, etc.). In one or more embodiments, regardless of the magnitude of the comparison signal from the comparator (208), the rising reference value is always incremented by the same fixed amount/interval. As another example, if the comparison signal from the comparator (208) indicates that the signal associated with the resulting signal is less than the reference signal ($V_{REF}$), the control module (208) may decrement the rising reference value by a fixed amount/interval "M" (e.g., −1, −5, −10, etc.). In various embodiments, the rising reference value may be modified by a non-integer amount. In one or more embodiments, regardless of the magnitude of the comparison signal from the comparator (208), the rising reference value is always decremented by the same fixed amount/interval.

In one or more embodiments, during the falling portion of each sensing cycle, the control module (209) modifies (e.g., decrements, increments) the falling reference value based on the comparison signal from the comparator (208). For example, in one embodiment, if the comparison signal from the comparator (208) indicates that the signal associated with the resulting signal exceeds the reference value ($V_{REF}$), the control module (208) may increment the falling reference value by a fixed amount/interval (e.g., +1, +4, +6, etc.). In one or more embodiments, regardless of the magnitude of the comparison signal, the falling reference value is always incremented by the same fixed amount/interval. As another example, if the comparison signal from the comparator (208) indicates that the signal associated with the resulting signal is less than the reference signal ($V_{REF}$), the control module (208) may decrement the falling reference value by a fixed amount/interval "−M"(e.g., −1, −4, −6, etc.). In various embodiments, the falling reference value may be modified by a non-integer amount. In one or more embodiments, regardless of the magnitude of the comparison signal, the falling reference value is always decremented by the same fixed amount/interval.

In one or more embodiments, the control module (209) sets the DAC (210) corresponding to the modified rising reference value and modified falling referenced value for the rising portion and the falling portion, respectively, of the next sensing cycle.

In one or more embodiments, the receiving module (205) operates in at least two states: excited state and steady-state. The excited state exists when an input object initially enters the sensing region (220) or when an input object is initially removed from the sensing region (220). In the excited state, the capacitance between a first and second sensor electrode in the sensing region (220) or between a sensor electrode in the sensing region (220) and input object is changing because of the input object that has just been added or removed from the sensing region (220). The changing capacitance is reflected in the resulting signal. In contrast, in steady-state, the capacitance is substantially stable because the input object has been present in or absent from the sensing region (220) for some time. The stable capacitance is also reflected in the resulting signal.

In one or more embodiments, the electrical properties/components (207, 208, 209, 210, 212) of the receiving module (205) and the increment/decrement intervals of the control module (209) are selected such that during steady-state conditions, the rising reference value and the falling reference value each oscillate between two values. Assume sensing cycle A, sensing cycle B, and sensing cycle C are three consecutive sensing cycles during steady-state. Moreover, assume signal X and $V_{REF}$ are the two signals being compared by the comparator (208) during the three consecutive sensing cycles (A, B, C). In various embodiments, for the oscillation of the rising reference value to exist, signal X>$V_{REF}$ during the rising portion of sensing cycle A and sensing cycle C, and $V_{REF}$>signal X during the rising portion of sensing cycle B. A similar relationship exists during steady-state for the falling portion of the three consecutive sensing cycles.

In one or more embodiments, the electrical properties/components (207, 208, 209, 210, 212) of the receiving module (205) and the increment/decrement intervals of the control module (209) are selected such that during the excited state, the rising reference value and the falling reference value both ramp, but in opposite directions. For example, when an input object is initially entered in the sensing region, the rising reference value may ramp up, while the falling reference value may ramp down. Similarly, when the input object is initially removed from the sensing region, the rising reference value may ramp down while the falling reference value ramps up. Assume sensing cycle D, sensing cycle E, and sensing cycle F are three consecutive sensing cycles during the excited state. Moreover, assume signal Y and $V_{REF}$ are the two signals being compared by the comparator (208) during the three consecutive sensing cycles (D, E, F). For the ramping to exist, signal Y>$V_{REF}$ during the rising portion of all three consecutive sensing cycles (D, E, F). A similar relationship exists during the excited state for the falling portion of the three consecutive sensing cycles.

In one or more embodiment, the receiver module (205) includes the feedback path (212). The feedback path (212) is used to create the oscillations during steady-state and the ramping during the excited state. Specifically, in various embodiments, the feedback path (212) is a linear connection between the output of the DAC (210) and an input node of the comparator (208) via a offset capacitor (discussed below) and the accumulator circuitry (207), if present. In many embodiments, the feedback path (212) effectively strives to keep the input node of the comparator (208) at a substantially constant value.

As discussed above, in one or more embodiments, the resulting signal comprises effects corresponding to interference from any number of sources. Although the interference may be significant and have a drastic effect on the comparison signals, the rising reference value and the falling reference value may only change (increment, decrement) by the fixed amounts/intervals. In many embodiments, when the interference is mitigated during steady-state, both the rising reference value and the falling reference value will each recover quickly and resume oscillation between two values (i.e., return to steady state). In such embodiments, the rising and falling reference values and/or the steady state period may be below input object determination thresholds, but above interference detection thresholds. In one more embodiments, interference events may be reported by the determination module based on a value threshold of the rising and falling reference values (or a comparison between the rising and falling values) and steady state length threshold. In one embodiment, interference may be detected based on a comparison of the rising reference value to one or more threshold or based on a comparison of the falling reference value to one or more thresholds. In one or more embodiments, processing system (215) may change one or more operating parameters based on the determined interference. The operating parameters may include, but is not limited to, a transmitter signal frequency, one or more digital codes used to determine the transmitter signal, the amplitude of the transmitter signal frequency, etc. In any of the above embodiments, the thresholds may be adjustable. In one or more embodiments, a measurement of the interference may be determined based on a comparison comprising the rising reference value, falling reference value, and one more thresholds.

In one or more embodiments, the processing system (215) includes the determination module (225). The determination module (225) is configured to determine positional information for an input object in a sensing region of the input device based on the rising reference value and the falling reference value. Specifically, the determination module (225) may identify differences, patterns, trends, etc. based on the rising reference value and the falling reference value to determine the positional information including of an input object in the sensing region (220). For example, in various embodiments, one or more thresholds may be used to determine positional information. The thresholds may include, a value threshold of the rising and/or falling reference values, a value threshold of the comparison between the rising and falling reference values, and/or a steady state length threshold for the rising and falling reference values. In one embodiment, when the comparison between the rising and falling reference values satisfies a corresponding threshold and when the steady state length threshold is satisfied, an input object may be determined to be in the sensing region. Together the threshold are used to make sure an input object is sufficiently proximate to the sensing region and in the sensing region for a predetermined amount of time. In any of the above embodiments, the thresholds may be adjustable.

As discussed above, when an input object is introduced to the sensing region (220), the rising reference value and the falling reference value will diverge (i.e., one will continue to increment, while the other will continue to decrement) until a new steady-state is reached. In one or more embodiments, the determination module (225) identifies the presence of an input object in the sensing region (220) by comparing the rising reference value and the falling reference value. If the comparison exceeds a threshold, an input object is deemed to be present in the sensing region (220). If the comparison falls short of the threshold, an input object is not deemed to be present in the sensing region (220). In one embodiment, the comparison may comprise taking a difference. Further, the determination module may also compare steady state period during which the rising and falling reference values satisfy a threshold value or the comparison of the rising and falling reference values satisfy a threshold value to a steady state threshold. In such embodiments, an input object may be determined to be detected when the steady state threshold has been satisfied. The determination module (225) may include any hardware and/or software necessary to: compare the rising reference value and the falling reference value; identify patterns/trends (e.g., ramping, length of steady state periods, peak values, or peak comparison values) associated the rising reference value and the falling reference value; perform one or more thresholding techniques; perform one or more filtering operations on the rising reference value and/or falling reference value; and issue one or more flags or data to indicate the change in capacitance in the sensing region due to the presence of an input object.

Figure 3A:
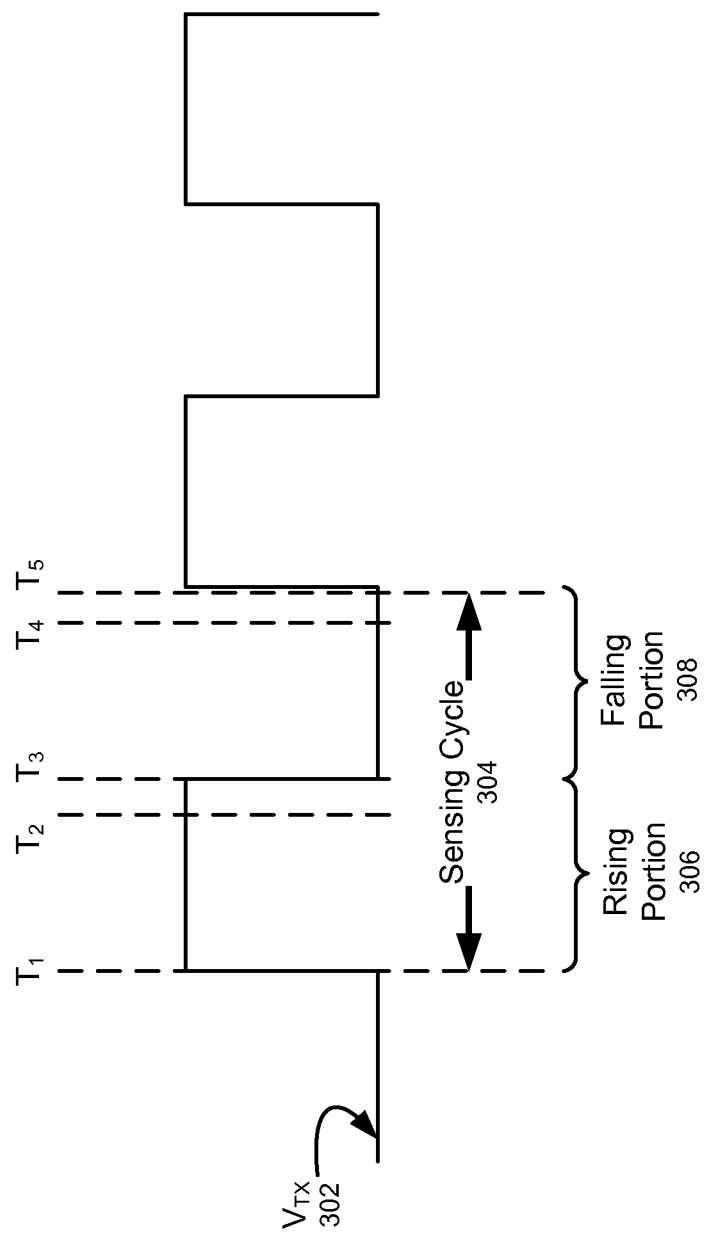
FIG. 3A is a timing diagram in accordance with one or more embodiments of the invention.

FIG. 3A shows an example timing diagram in accordance with one or more embodiments of the invention. The timing diagram shown in FIG. 3A may correspond to the processing system (215) discussed above in reference to FIG. 2. Specifically, FIG. 3A shows the transmitter signal ($V_{TX}$) (302). In one embodiment the transmitter signal ($V_{TX}$) (302) is a square wave. In other embodiments, the transmitter signal may comprise other types of waveforms. In the illustrated example, the transmitter signal ($V_{TX}$) (302) switches between two voltages. For purposes of this discussion, assume that a first transition occurs at time $T_1$, where the transition is from a low to high voltage, and a second transition occurs at time $T_3$, where the transition is from a high to low voltage, although, in most cases the designation of a "first transition" and a "second transition" is arbitrary. A third transition occurs at time $T_5$, where the transition again is from a low to high voltage. The time interval between $T_1$ and $T_5$ represents the sensing cycle (304). $T_3$ partitions the sensing cycle into two portions: the rising portion (306) and the falling portion (308).

In this example, an initial accumulation of the input signal by the accumulator circuitry (207) begins at or shortly after the first transition $T_1$, and ends at approximately time $T_2$. Similarly, a subsequent accumulation of the input signal by the accumulator circuitry (207) begins at or shortly after time $T_3$, and ends approximately at time $T_4$. The time interval between $T_1$ and $T_2$ and the time interval between $T_3$ and $T_4$ may each be referred to as an integration phase. During the time interval between $T_2$ and $T_3$, and the time interval between $T_4$ and $T_5$, the accumulator circuitry (207) is reset. The time interval between $T_2$ and $T_3$ and the time interval between $T_4$ and $T_5$ may each be referred to as a reset phase. In various embodiments, the starting periods, ending periods and the lengths of the integration and reset phase may differ from the illustrated example. For example, the integration phase may be shorter or longer than illustrated, the reset phase may be shorter or longer than illustrated and integration and reset phases may occur at different times than illustrated.

Figure 3B:
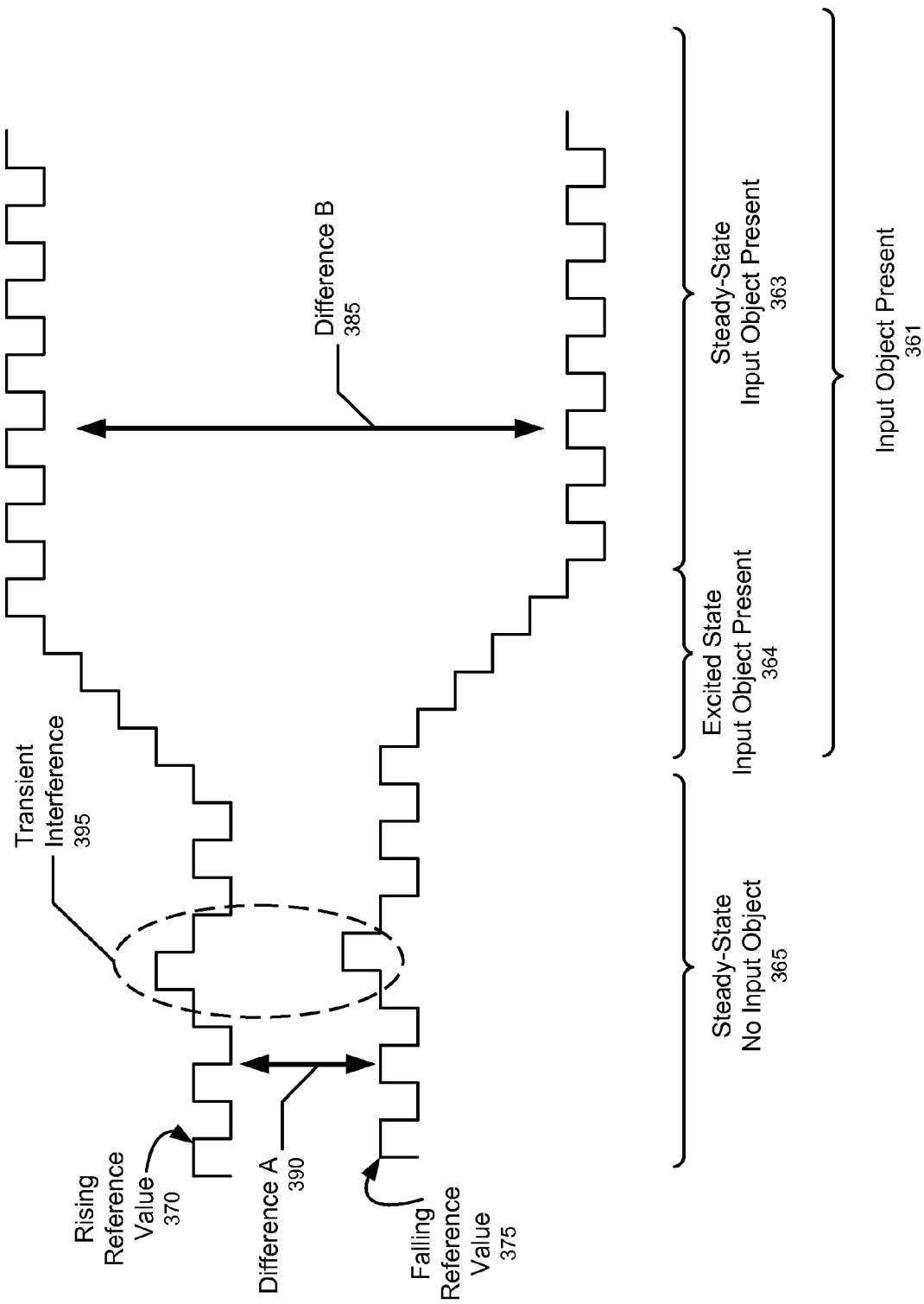
FIG. 3B is a timing diagram in accordance with one or more embodiments of the invention.

FIG. 3B shows an example timing diagram in accordance with one or more embodiments of the invention. The timing diagram may correspond to the processing system (215) discussed above in reference to FIG. 2. Specifically, FIG. 3B shows the rising reference value (370) and the falling reference value (375). As shown in FIG. 3B, during a steady-state (365) when an input object is not present and has not been present for some time, both the rising reference value (370) and the falling reference value (375) oscillate between two numbers. When transient interference (395) is present, the rising reference value (370) and the falling reference value (375) temporarily deviate from the oscillations. In one embodiment, as shown in FIG. 3B, when transient interference (395) is present, the rising reference value (370) and the falling reference value (375) temporarily deviate in the same direction. As discussed above, regardless of the magnitude of the transient interference (395), the rising reference value (370) and the falling reference value (375) will only increment/decrement by the predetermined fixed amount/interval in each sensing cycle. Accordingly, once the transient interference (395) is mitigated, the rising reference value (370) and the falling reference value (375) quickly recover and resume the oscillations.

Still referring to FIG. 3B, during an excited state (364) when an input object is introduced to the sensing region (220), the rising reference value (370) and the falling reference value (375) ramp in opposite directions. The ramping continues until a new steady-state (363), with the input object present, is reached. During the new steady-state (363), the rising reference value (370) and the falling reference value (375) each oscillate between two new numbers.

As shown in FIG. 3B, the difference (i.e., Difference B (385)) between the reference values (370, 375) during the new steady-state (363) is much greater than the difference (i.e., Difference A (390)) between the two reference values (370, 375) during the previous steady-state (365). In one or more embodiments, the determination module (225) relies, at least partially, on the large change from difference A (390) to difference B (385) to determine that an input object is present in the sensing region (220). The determination module (225) may also rely, at least partially, on the ramping to determine the presence of an input object.

Although not shown in FIG. 3B, once the input object is removed from the sensing region (220), the reference values (370, 375) may return to the behavior observed during the previous steady-state condition (365). Specifically, the difference between the two reference values (375, 370) shrinks compared to difference B (385). The determination module (225) relies, at least partially, on this change to determine that the input object is no longer present in the sensing region (220).

Example circuitry and/or software causing/triggering/responsible for the behavior of the rising reference value and the falling reference value shown in FIG. 3B is discussed below.

Figure 4:
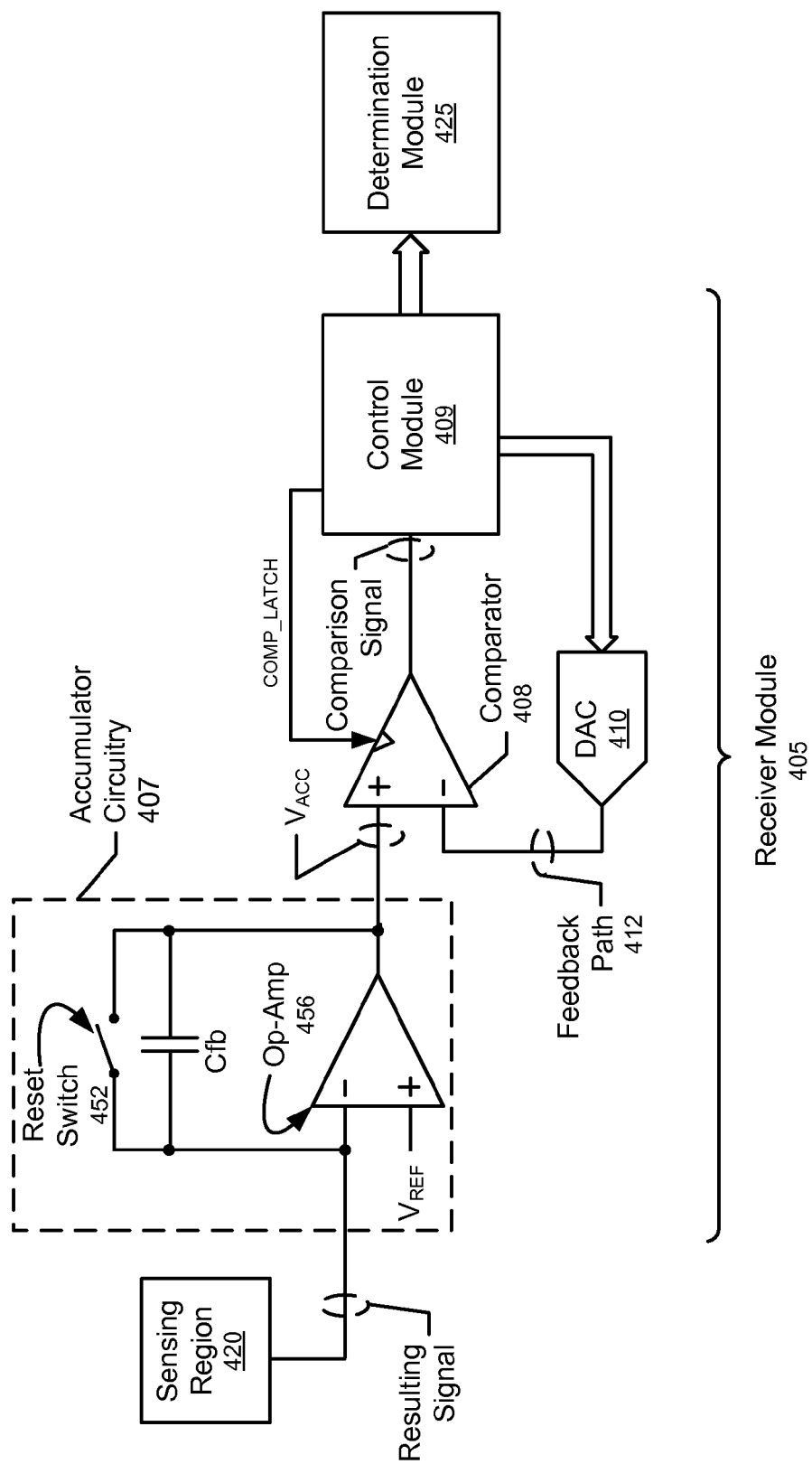
FIG. 4 is example circuitry in accordance with one or more embodiments of the invention.

FIG. 4 shows an example in accordance with one or more embodiments of the invention. As shown in FIG. 4, transmitter module (not shown) is configured to drive a transmitter signal onto at least one sensor electrode overlapping the sensing region (420). The receiver module (405) with the determination module (425) are configured to digitally measure changes in the capacitive coupling between the at least one sensor electrode and at least one other sensor electrode in the sensing region (420). In one or more embodiments, the receiver module (405) comprises accumulator circuitry (407), a comparator (408), a DAC (410), and a control module (409). The transmitter module (not shown), the receiver module (405), the sensing region (420), and the determination module (425) may correspond to the transmitter module (203), the receiver module (205), the sensing region (220), and the determination module (225), respectively, discussed above in reference to FIG. 2. The accumulator circuitry (407), the comparator (408), the DAC (410), and the control module (409) are example implementations of the accumulator circuitry (207), the comparator (208), the DAC (210), and the control module (209), respectively, discussed above in reference to FIG. 2.

In one or more embodiments, the accumulator circuitry (407) includes an operational amplifier (456). A reference voltage ($V_{REF}$) is applied to the non-inverting input of the operational amplifier (456), while a sensor electrode is ohmically coupled to the inverting input of the operational amplifier (456). Specifically, it is the resulting signal that is fed to the inverting input of the operational amplifier (456). The operational amplifier (456) includes a feedback circuit with a reset switch (452). The reset switch (452) is used to reset the accumulator circuitry (407) at approximately the start of the rising portion of a sensing cycle and at approximately the start of the falling portion of the sensing cycle. The output of the operational amplifier (456) ($V_{ACC}$) represents the charge accumulated by the operational amplifier (456) from the resulting signal since the last reset. Those skilled in the art, having the benefit of this detailed description, will appreciate that the output of the operational amplifier (456) will follow $V_{REF}$ in response to application of the reset switch (452). The reset switch (452) provides a DC feedback and a high-pass filter function. While in the illustrated embodiment of FIG. 4, a reset switch (452) is shown and described, in various embodiments, the reset switch (452) may be replaced with a reset resistor or similar circuit component that is able to provide DC feedback to the inverting input of the comparator.

In one or more embodiments, the receiver module (405) includes the DAC (410). The DAC (410) is set to a rising reference value and a falling reference value for the rising portion and the falling portion, respectively, of each sensing cycle. Specifically, the DAC (410) outputs an analog signal corresponding to the digital rising reference value for the rising portion of the sensing cycle. Moreover, the DAC (410) outputs an analog signal corresponding to the digital falling reference value for the rising portion of the sensing cycle.

In one or more embodiments, the receiver module (405) includes the comparator (408). As shown in FIG. 4, the output of the operational amplifier (456) ($V_{ACC}$) is fed to the non-inverting input of the comparator, while the feedback path (412) feeds the output signal of the DAC (410) to the inverting input of the comparator (408). The comparator (408) compares the output of the operational amplifier (456) and the output of the DAC (410) and switches its output to indicate which of the two signals is larger. The output of the comparator (408) is referred to as a comparison signal. While FIG. 4, shows the output of the operational amplifier (456) ($V_{ACC}$) being fed to the non-inverting input of the comparator, and the feedback path (412) feeding the output signal of the DAC (410) to the inverting input of the comparator (408), in other embodiments, this may be reversed, and the comparator may be configured to operate in an inverting state. In such embodiments, parameters of the control module (409), DAC (410), and/or determination module (425) may also be altered to perform with the comparator configured to function in an inverting state.

In one or more embodiments, the receiver module (405) includes the control module (409). The control module (409) stores the rising reference value and the falling reference value. The control module (409) sets the DAC (410) to the stored rising reference value and the stored falling reference value during the rising portion and the falling portion, respectively, of each sensing cycle.

During the rising portion of each sensing cycle, the control module (409) modifies the rising reference value based on the comparison signal from the comparator (408) by ±M. If the comparison signal indicates that $V_{ACC}$ exceeds the output signal of the DAC (410), the control module (409) may increment the rising reference value by +M. If the comparison signal from the comparator (408) indicates that $V_{ACC}$ is less than the output signal of the DAC (410), the control module (409) decrements the rising reference value by −M. During the falling portion of each sensing cycle, the control module (409) modifies the falling reference value based on the comparison signal from the comparator (408). If the comparison signal from the comparator (408) indicates that $V_{ACC}$ exceeds the output signal of the DAC (410), the control module (409) increments the falling reference value by +M. If the comparison signal from the comparator (408) indicates that $V_{ACC}$ is less than the output signal of the DAC (410), the control module (409) decrements the falling reference value by −M.

In one or more embodiments, the control module (409) sets the DAC (410) corresponding to the modified rising reference value and falling reference value for the rising portion and the falling portion, respectively, of the next sensing cycle.

As discussed above, in steady state, the rising reference value and the falling reference value will each oscillate between two numbers. For example, oscillation of the rising reference value results from the output of the DAC (410) swinging above the $V_{ACC}$ in the rising portion of one sensing cycle and then below the $V_{ACC}$ in the rising portion of the next (consecutive) sensing cycle. In the presence of a transient interferer (such as a square wave), the rising reference value or the falling reference value may change by one unit and quickly recover. In the presence of slow interferences (such as sine waves), the rising reference value and the falling reference value will track each other and the difference will be constant. In various embodiments, the presence of interference may be determined based on a rising and falling reference values. In one or more embodiments, when interference is detected, one or more functions may be carried out to mitigate the interference.

As also discussed above, in the excited state, the rising reference value and the falling reference value will ramp. For example, the ramping of the rising reference value results from $V_{ACC}$ being larger than the output of the DAC (410) during the rising portion of multiple consecutive sensing cycles.

In one or more embodiments, the determination module (425) is configured to identify differences, patterns, trends, etc. based on the rising reference value and the falling reference value. Specifically, the determination module (425) is configured to identify whether an input object is present in the sensing region (420) based on the changes in the rising reference value and the falling reference value. The determination module (425) may also be configured to identify when interference is present. The determination module (425) may set one or more flags (or provide any other indication) when an input object is deemed present in the sensing region (420) and/or when interference is deemed present. Additional processing may be performed on any data/signal/flag outputted by the determination module (425).

Figure 5:
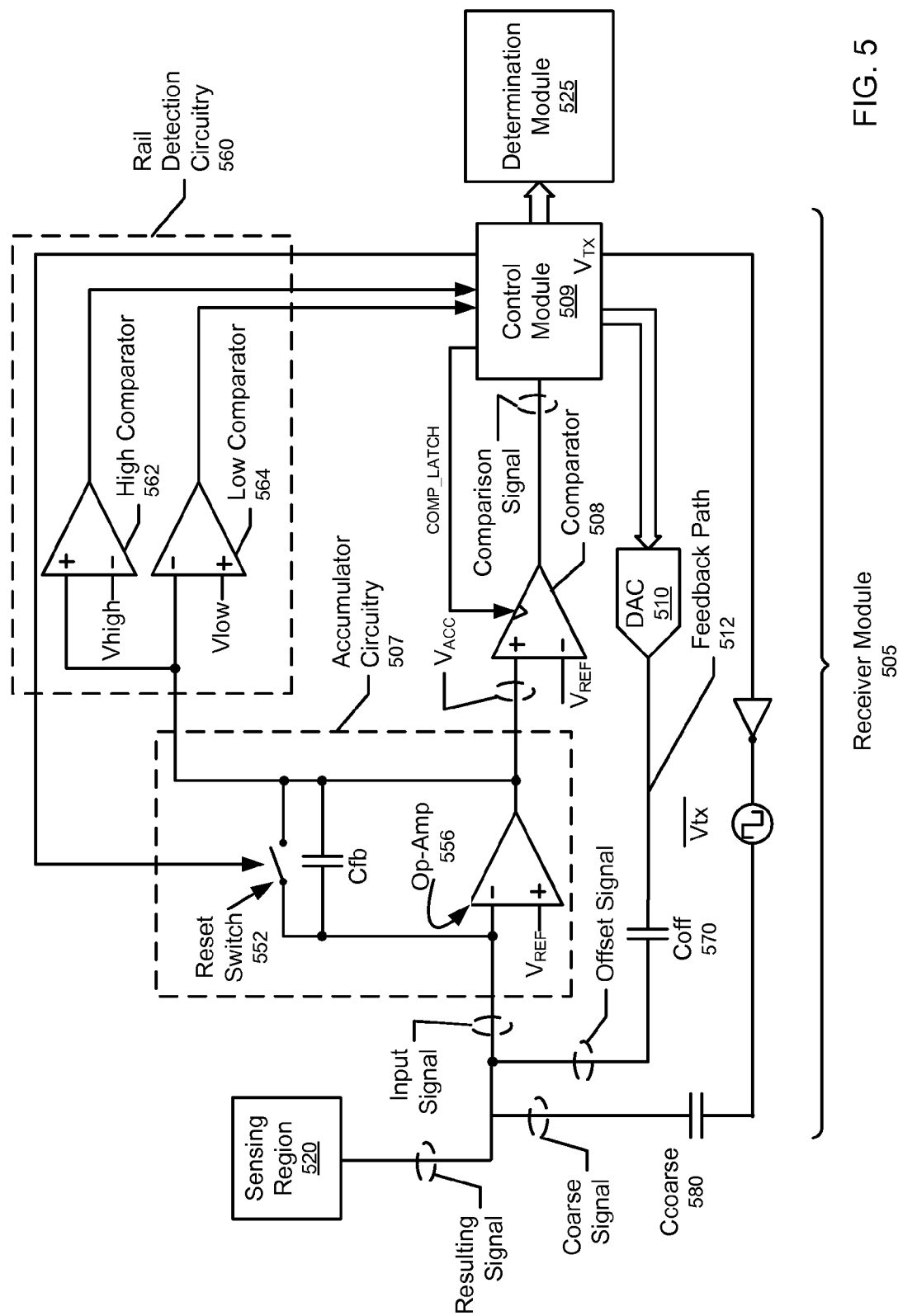
FIG. 5 is example circuitry in accordance with one or more embodiments of the invention.

FIG. 5 shows an example in accordance with one or more embodiments of the invention. As shown in FIG. 5, transmitter module (not shown) is configured to drive a transmitter signal onto at least one sensor electrode overlapping the sensing region (520). The receiver module (505) with the determination module (525) are configured to digitally measure changes in the capacitive coupling between the at least one sensor electrode and at least one other sensor electrode in the sensing region (520). In one or more embodiments, the receiver module (505) comprises accumulator circuitry (507), a comparator (508), a DAC (510), an offset capacitor (570), a coarse capacitor (580), rail detection circuitry (560), and a control module (509). The transmitter module (not shown), the receiver module (505), the sensing region (520), and the determination module (525) may correspond to the transmitter module (203), the receiver module (205), the sensing region (220), and the determination module (225), respectively, discussed above in reference to FIG. 2. The accumulator circuitry (507), the comparator (508), the DAC (510), and the control module (509) are example implementations of the accumulator circuitry (207), the comparator (208), the DAC (210), and the control module (209), respectively, discussed above in reference to FIG. 2.

In one or more embodiments, the accumulator circuitry (507) includes an operational amplifier (556). A reference voltage ($V_{REF}$) is applied to the non-inverting input of the operational amplifier (556), while an input signal is fed to the inverting input of the operation amplifier (556). The input signal has multiple components including the resulting signal from a sensor electrode in the sensing region (520), an offset signal (discussed below), and/or a coarse signal (discussed below). The operational amplifier (556) includes a feedback circuit with a reset switch (552). The reset switch (552) is used to reset the accumulator circuitry (507). The accumulator circuitry (507) operates essentially the same as the accumulator circuitry (407), discussed above in reference to FIG. 4.

In one or more embodiments, the receiver module (505) includes the DAC (510). The DAC (510) is set to a rising reference value and a falling reference value for the rising portion and the falling portion, respectively, of each sensing cycle. The DAC (510) may be configured to operate essentially the same as the DAC (410), discussed above in reference to FIG. 4. In various embodiments, the DAC (510) is configured to "swing" between a first voltage level and a second voltage based on whether it is set to the rising reference value or the falling reference value. In one embodiment, the first voltage level is higher than the second voltage level. In one embodiment, one of the first voltage level and the second voltage level is set to a reference voltage and the other is set to a rail voltage level.

In one or more embodiments, the receiver module (505) includes the comparator (508). As shown in FIG. 5, the output of the operational amplifier (556) ($V_{ACC}$) is fed to the non-inverting input of the comparator, while the reference signal ($V_{REF}$) is fed to the inverting input of the comparator (508). The comparator (508) compares the output of the operational amplifier (556) ($V_{ACC}$) with $V_{REF}$ and switches its output to indicate which of the two signals is larger. The output of the comparator (508) is referred to as a comparison signal. While FIG. 5, shows the output of operational amplifier (556) ($V_{ACC}$) being fed to the non-inverting input of the comparator and the reference signal ($V_{REF}$) being fed to the inverting input of the comparator, in other embodiments, this may be reversed, and the comparator (508) may be configured to operate in an inverting state. In such embodiments, parameters of the control module (509), DAC (510), and/or determination module (525) may also be altered to perform with the comparator (508) configured to function in an inverting state.

In one or more embodiments, the receiver module (505) includes rail detection circuitry (560). The rail detection circuitry (560) is configured to determine when the operational amplifier (556) is railing. As shown in FIG. 5, the rail detection circuitry (560) includes a high comparator (562) and a low comparator (564). Vhigh is a voltage slightly below (i.e., within some threshold) the high voltage rail of the operational amplifier (556) and is fed to the inverting input of the high comparator (562). Vlow is a voltage slightly above (i.e., within some threshold) the low voltage rail of the operational amplifier (556) and is fed to the non-inverting input of the low comparator (564). The output of the operational amplifier (556) is fed to the remaining inputs of the low comparator (564) and the high comparator (562). The outputs of the high comparator (562) and the low comparator (564) are inputs to the control module (509). Those skilled in the art, having the benefit of this detailed description, will appreciate that the low comparator (564) will detect the operational amplifier (556) railing at the lower rail, while the high comparator (562) will detect the operational amplifier (556) railing at the higher rail.

Those skilled in the art, having the benefit of this detailed description, will appreciate that a purpose of the operational amplifier (556) is to keep the voltage at the input node constant. If the input charge is too large, the operational amplifier (556) will rail and the input node will change voltage. By detecting when the operational amplifier (556) has railed, the control module (509) can close the reset switch (552), keeping the input node at $V_{REF}$. Alternatively, the control module (509) could connect the input to $V_{REF}$, if it is low enough impedance. Moreover, those skilled in the art, having the benefit of this detailed description, will appreciate that the rail detection circuitry (560) is optional.

In one or more embodiments, the receiver module (505) includes the control module (509). The control module (509) stores the rising reference value and the falling reference value. The control module (509) sets the DAC (510) corresponding to the rising reference value and the falling reference value during the rising portion and the falling portion, respectively, of each sensing cycle.

During the rising portion of each sensing cycle, the control module (509) modifies the rising reference value based on the comparison signal from the comparator (508). If the comparison signal indicates that $V_{ACC}$ exceeds $V_{REF}$, the control module (509) may increment the rising reference value by a predetermined amount/interval. If the comparison signal from the comparator (508) indicates that $V_{ACC}$ is less than $V_{REF}$, the output signal the control module (509) decrements the rising reference value by a predetermined amount/interval. During the falling portion of each sensing cycle, the control module (509) modifies (e.g., decrements, increments) the falling reference value based on the comparison signal from the comparator (508). If the comparison signal from the comparator (508) indicates that $V_{ACC}$ exceeds $V_{REF}$, the control module (509) increments the falling reference value by a predetermined amount/interval. If the comparison signal from the comparator (508) indicates that $V_{ACC}$ is less than $V_{REF}$, the control module (509) decrements the falling reference value by a predetermined amount/interval. The control module (509) operates essentially the same as the control module (409), discussed above in reference to FIG. 4.

In one or more embodiments, the control module (509) activates/closes the reset switch (552) in response to the rail detection circuitry (560) detecting the operational amplifier (556) is railing.

As discussed above, in steady-state, the rising reference value and the falling reference value will each oscillate between two numbers. For example, the oscillation of the rising reference value results from $V_{ACC}$ exceeding $V_{REF}$ in the rising portion of one sensing cycle and then falling below $V_{REF}$ in the rising portion of the next (consecutive) sensing cycle. This sequence then repeats. As also discussed above, the swinging nature of $V_{ACC}$ during steady-state is caused by the feedback path (512). Specifically, the output of the DAC (510) drives the offset capacitor (570) and the resulting offset signal is a component of the input signal fed into the accumulator circuitry (507). Accordingly, both the offset signal and the resulting signal affect $V_{ACC}$. It is the oscillating rising reference value that subsequently causes $V_{ACC}$ to swing between the rising portions of two consecutive sensing cycles. Similarly, it is the oscillating falling reference value that subsequently causes $V_{ACC}$ to swing between the falling portions of two consecutive sensing cycles.

As also discussed above, in the excited state, the rising reference value and the falling reference value will ramp. For example, the ramping of the rising reference value results from $V_{ACC}$ being larger than $V_{REF}$ during the rising portion of multiple consecutive sensing cycles. Like before, this is also caused by the feedback path (512). During the excited state, the resulting signal is changing (e.g., increasing) to reflect the changing capacitance in the sensing region (520). The offset signal is insufficient to counter the changing (e.g., increasing) resulting signal, and thus $V_{ACC}$ remains greater than $V_{REF}$ over the multiple sensing cycles. This continues until the resulting signal (and capacitance in the sensing region) stabilizes, the offset signal catches up, and once again causes $V_{ACC}$ to swing above and below $V_{REF}$.

In one or more embodiments, during a reset phase (i.e., while the reset switch (552) is closed), the DAC (510) is set to a first or second substantially constant voltage, one being at a higher voltage level than the other. In one embodiment, the first and second substantially constant voltages may be referred to as $V_{HI}$ and $V_{LO}$. Then, during the subsequent integration phase (i.e., the reset switch (552) is opened), the transmitter signal ($V_{TX}$) transitions and the DAC (510) is set to the rising reference value or the falling reference value.

In one or more embodiments, as an alternative to setting the DAC (510) to $V_{HI}$ or $V_{LO}$, one or more switches (not shown) in the feedback path (512) are used to connect the lower plate of the offset capacitor (570) to $V_{HI}$ or $V_{LO}$ during the reset phase. Then, during the integration phase, these switches connect the lower plate of the offset capacitor (570) to the output of the DAC (510).

Those skilled in the art, having the benefit of this detailed description, will appreciate that by using the offset capacitor (570), various operating parameters of the processing system may be reduced. For example, in one embodiment, the feedback capacitor (Cfb) in the accumulator circuitry (507) may be smaller. Further, in the absence of interferers, the output of the operational amplifier (556) ($V_{ACC}$) will be near mid-rail (i.e., the comparator (508) only has to operate at mid-rail). In another embodiment, the receiver module may be configured to operate within a lower dynamic range as compared to receiver module not comprising an offset capacitor (570). As such, the receiver module may be configured to respond to resulting signals initially being outside the dynamic range of the receiver module, but by means of the offset capacitor (570), the resulting signals may be modified such that they may be processed by the receiver module.

In one or more embodiments, the receiver module (505) includes a coarse capacitor (580). The coarse capacitor (580) is driven by an inversion of the transmitter signal ($V_{TX}$). Moreover, the coarse signal from the coarse capacitor (580) is a component of the input signal to the operational amplifier (556). The use of the coarse capacitor (580) driven by the inverse of the transmitter signal ($V_{TX}$) allows for a lower precision DAC (510) yet maintain the same dynamic range.

In one or more embodiments, the receiver module (505) may include additional switches (not shown) to pre-charge the coarse capacitor (580) (and even the offset capacitor (570)). Pre-charging the coarse capacitor (580) may effectively double the amount of charge that the coarse capacitor (580) can add or subtract. The coarse capacitor (580) may be pre-charged and then connected multiple times during the rising portion of the sensing cycle and the falling portion of the sensing cycle, effectively multiplying the capacitance of the coarse capacitor (580). Those skilled in the art, having the benefit of this detailed description, will appreciate that use of the coarse capacitor (580) and the inverted version of the transmitter signal ($V_{TX}$) are optional.

In one or more embodiments, the determination module (525) is configured to identify differences, patterns, trends, etc. based on the rising reference value and the falling reference value. Specifically, the determination module (525) is configured to identify whether an input object is present in the sensing region (520) based on the changes in the rising reference value and the falling reference value. The determination module (525) may also be configured to identify when interference is present. The determination module (525) operates essentially the same as the determination module (425) discussed above in reference to FIG. 4.

Figure 6:
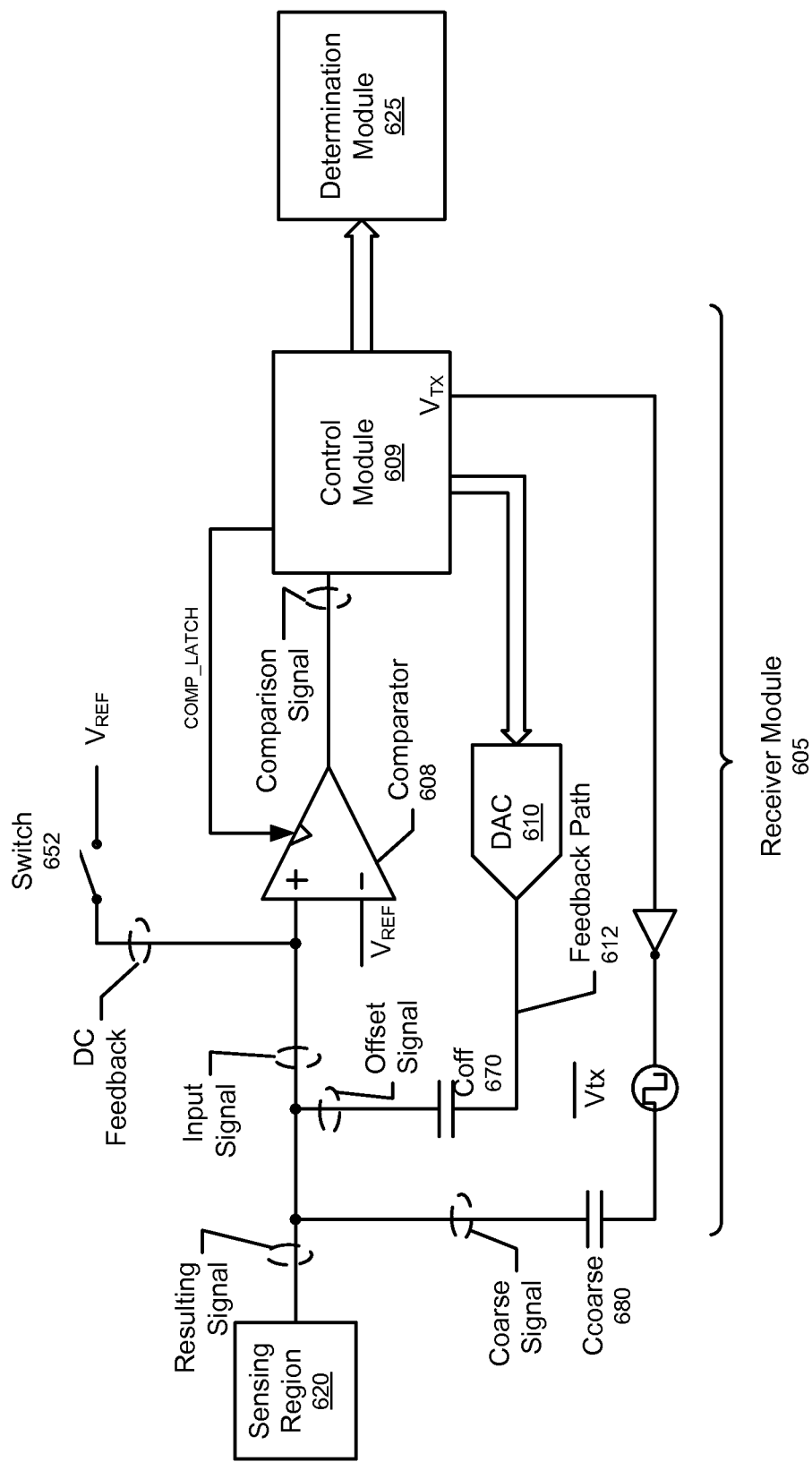
FIG. 6 is example circuitry in accordance with one or more embodiments of the invention.

FIG. 6 shows an example in accordance with one or more embodiments of the invention. As shown in FIG. 6, transmitter module (not shown) is configured to drive a transmitter signal onto at least one sensor electrode overlapping the sensing region (620). The receiver module (605) with the determination module (625) are configured to digitally measure changes in the capacitive coupling between the at least one sensor electrode overlapping the sensing region (620) and at least one other sensor electrode overlapping the sensing region (620). In one or more embodiments, the receiver module (605) comprises a comparator (608), a DAC (610), an offset capacitor (670), a coarse capacitor (680), and a control module (609). The transmitter module (not shown), the receiver module (605), the sensing region (620), and the determination module (625) may correspond to the transmitter module (203), the receiver module (205), the sensing region (220), and the determination module (225), respectively, discussed above in reference to FIG. 2. The comparator (608), the DAC (610), and the control module (609) are example implementations of the comparator (208), the DAC (210), and the control module (209), respectively, discussed above in reference to FIG. 2.

In one or more embodiments, the receiver module (605) operates in a similar manner to the receiver module (505), discussed above in reference to FIG. 5. Specifically, like the receiver module (505) in FIG. 5, the coarse capacitor (680) is driven by an inverted version of the transmitter signal ($V_{TX}$) and the feedback path (612) includes the offset capacitor (670) driven by the DAC (610). However, unlike the example in FIG. 5, the receiver module (605) does not include accumulator circuitry. Instead, the input signal is fed directly to the non-inverting input of the comparator (608). In the illustrated embodiment, receiver module (605) does not comprise an accumulator circuitry as the receiver module (605) relies on the charge associated with the offset capacitor (670), the input capacitors, and any parasitic capacitance present in the input device.

As before, the feedback path (612) strives to maintain a constant value at the non-inverting input of the comparator (608). During the reset phase, DC feedback may be provided to the non-inverting input of the comparator (608) using a switch (652) or a resistor (not shown) to some constant voltage (e.g., $V_{REF}$). Since the comparator (608) reference is fixed, the comparator (608) may be implemented as a logic gate (e.g., D-flip flop).

Figure 7:
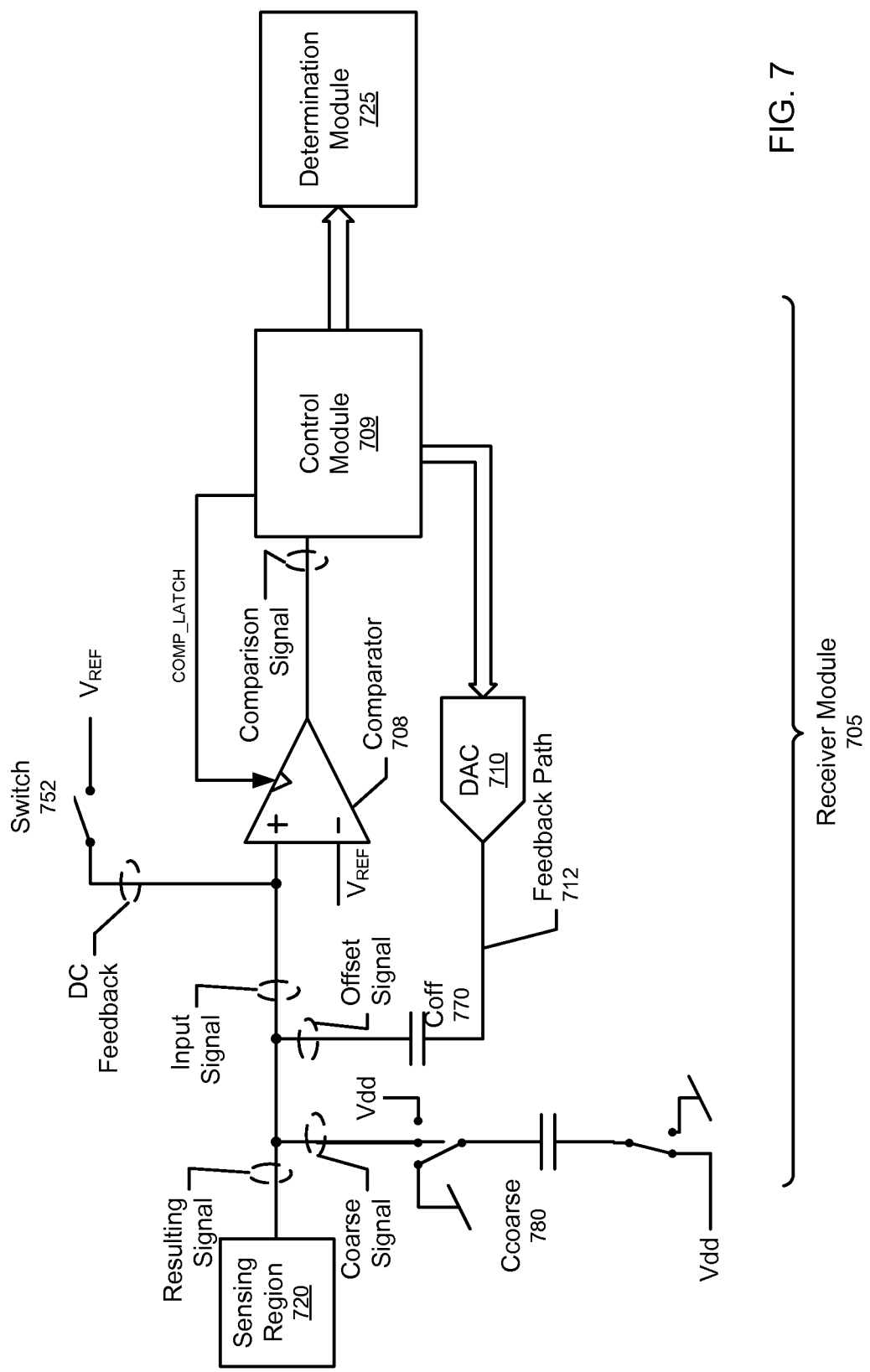
FIG. 7 is example circuitry in accordance with one or more embodiments of the invention.

FIG. 7 shows an example in accordance with one or more embodiments of the invention. As shown in FIG. 7, transmitter module (not shown) is configured to drive a transmitter signal onto at least one sensor electrode overlapping the sensing region (720). The receiver module (705) with the determination module (725) are configured to digitally measure changes in the capacitive coupling between the at least one sensor electrode and at least one other sensor electrode in the sensing region (720). In one or more embodiments, the receiver module (705) comprises a comparator (708), a DAC (710), a offset capacitor (770), a coarse capacitor (780), and a control module (709). The transmitter module (not shown), the receiver module (705), the sensing region (720), and the determination module (725) may correspond to the transmitter module (203), the receiver module (205), the sensing region (220), and the determination module (225), respectively, discussed above in reference to FIG. 2. The comparator (708), the DAC (710), and the control module (709) are example implementations of the comparator (208), the DAC (210), and the control module (209), respectively, discussed above in reference to FIG. 2.

In one or more embodiments, the receiver module (705) operates in a similar manner to the receiver module (605), discussed above in reference to FIG. 6. Specifically, like the receiver module (605) in FIG. 6, the feedback path (712) includes the offset capacitor (770) driven by the DAC (710), the input signal is fed directly into the non-inverting input of the comparator (708), and no accumulator circuitry (e.g., accumulator circuitry (507)) is present. During the reset phase, DC feedback may be provided to the non-inverting input of the comparator (708) using a switch (752). However, unlike the example in FIG. 6, the coarse capacitor (780) is not driven by an inverted version of the transmitted signal. Instead, for each transmitted step, the coarse capacitor (780) is discharged, one end (plate) is connected to the common capacitance node, and the other end (plate) is transition from $V_{HI}$ to $V_{LO}$ or $V_{LO}$ to $V_{HI}$. This effectively doubles the capacitance of the coarse capacitor (780). This discharge followed by transitioning may be executed multiple times during the rising portion and falling portion of a sensing cycle.

Although the discussion of FIG. 2-FIG. 7 has focused on an input device (220) that implements transcapacitance sensing, the input device (220) may also implement absolute capacitance sensing or a combination of transcapacitance sensing and absolute capacitance sensing. In the embodiments involving only absolute capacitance sensing, the transmitter signal is driven onto the same sensor electrode with which the resulting signal is received. In one or more embodiments, the receiver module (205) may establish the drive signal.

Figure 8:
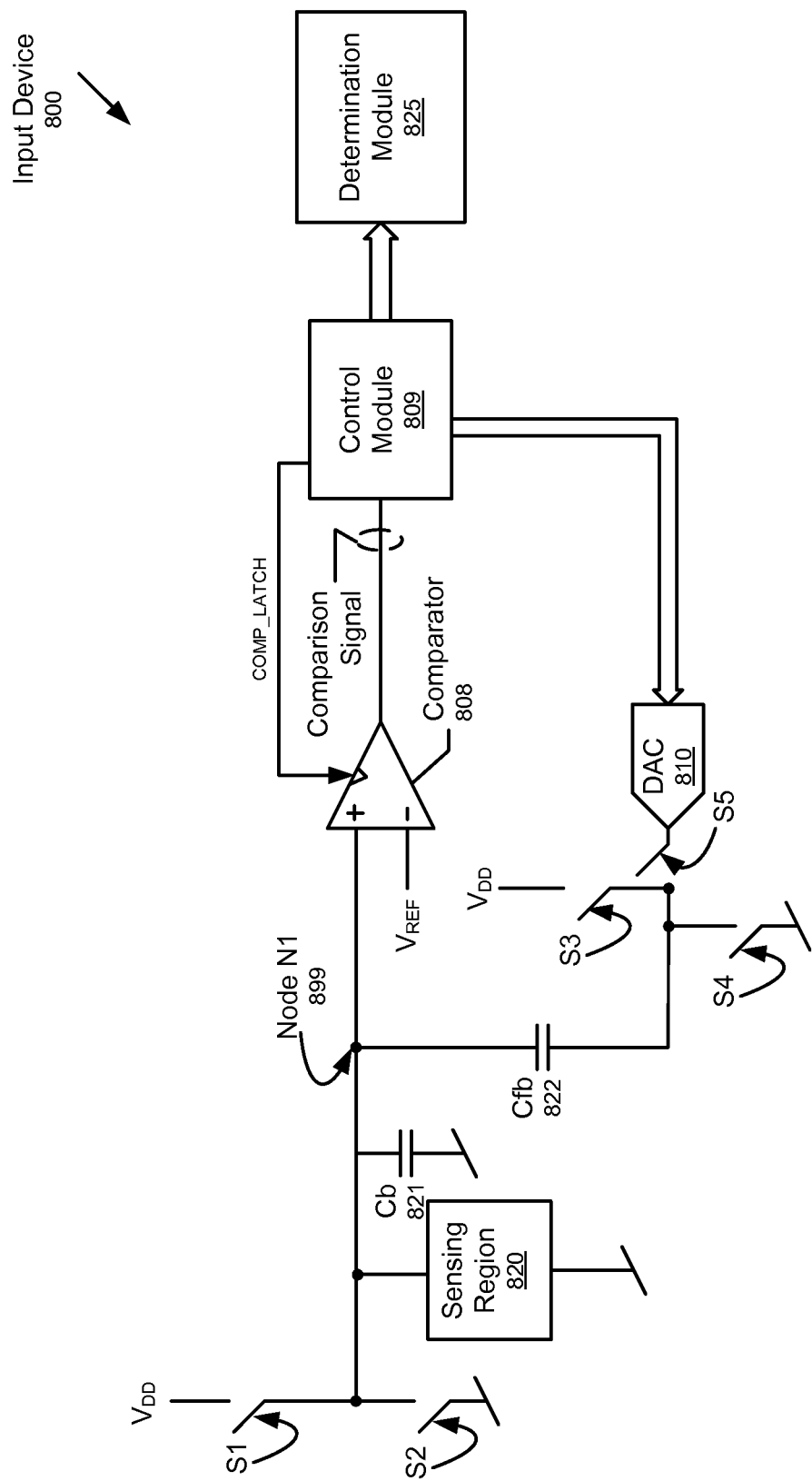
FIG. 8 is example circuitry in accordance with one or more embodiments of the invention.

FIG. 8 shows an example in accordance with one or more embodiments of the invention. Specifically, the example of FIG. 8 corresponds to input device (800) that implements absolute capacitance sensing or a hybrid of transcapacitance sensing and absolute capacitance sensing. As shown in FIG. 8, the input device (800) includes multiple switches (S1, S2, S3, S4, S5), a sensing region (820), a DAC (810), a comparator (808), a control module (809), and a determination module (825). The input device also includes a background capacitance Cb (821) and a feedback capacitor (822).

Switch S1 is closed to charge the background capacitance (Cb) (821) to Vdd. At the same time, switch S3 is closed, charging feedback capacitor (Cfb) (822) to Vdd. Switches S2, S4, and S5 are left open. The DAC (810) is set to the rising reference value. Switch S1 and S3 are opened and then switch S5 is closed. This removes charge from node N1 (899) via the feedback capacitor (Cfb) (822) and changes the voltage on node N1 (899). The comparator (808) determines if this voltage is above or below the reference voltage ($V_{REF}$). If above, the control module (809) decrements the rising reference value. If below, the control module (809) increments the rising reference value.

Next S5 is opened and switches S2 and S4 are closed while switches S1 and S3 remain open. The DAC (810) is set corresponding to the falling reference value. Switches S2 and S4 are then opened and then switch S5 is closed. This adds charge to node N1 (899) via the feedback capacitor (Cfb) (822) and changes the voltage on node N1 (899). The comparator (808) determines if this voltage is above or below the reference voltage ($V_{REF}$). If above, the control module (890) decrements the falling reference value. If below, the control module (890) increments the falling reference value.

The determination module (825) operates essentially the same to the determination module (225), discussed above in reference to FIG. 2. In other words, the determination module (825) is configured to determine positional information for an input object in a sensing region (820) of the input device based on the rising reference value and the falling reference value. Specifically, the determination module (825) may identify differences, patterns, trends, etc. based on the rising reference value and the falling reference value to determine the positional information including of an input object in the sensing region (820).

Figure 9:
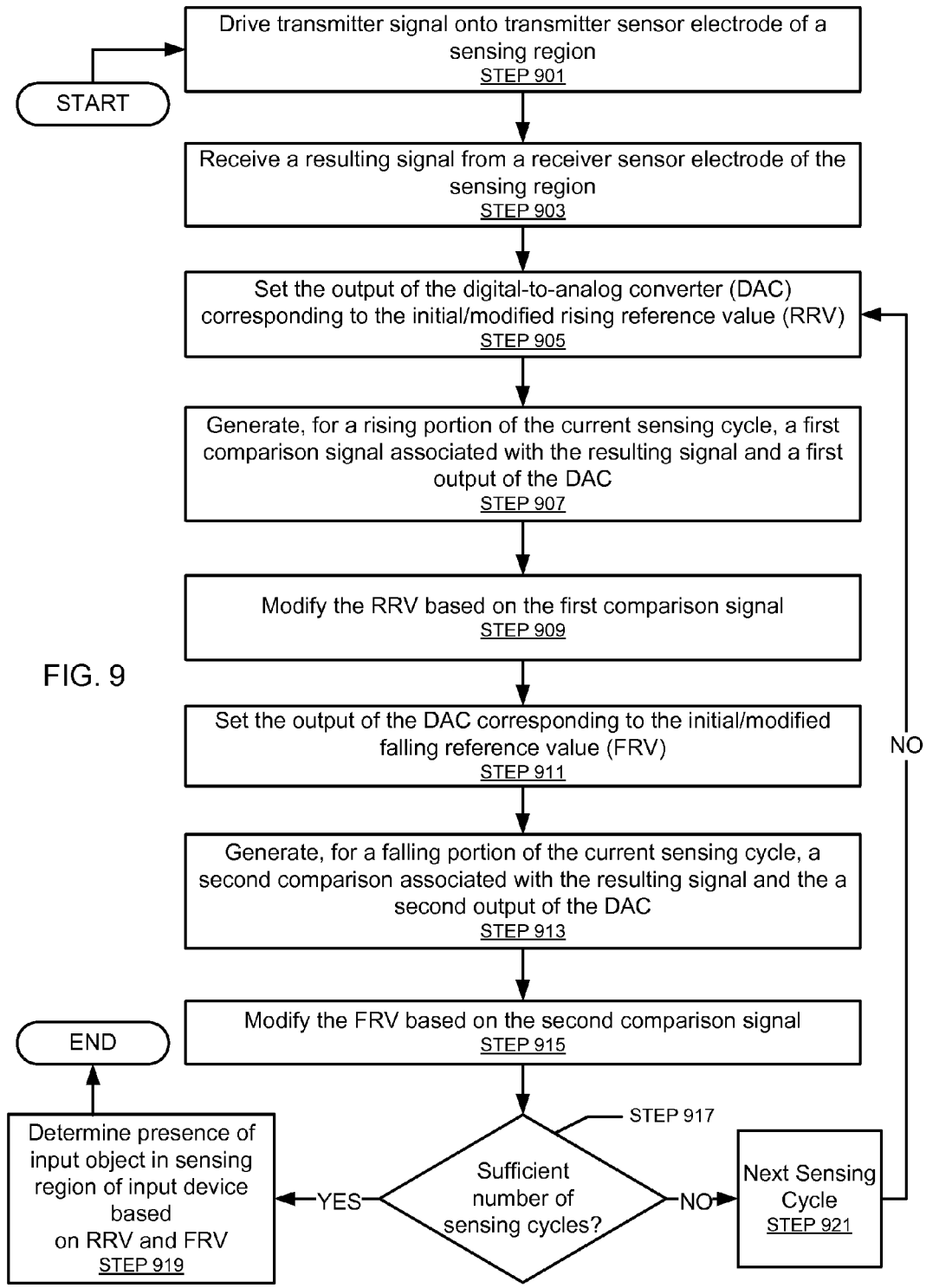
FIG. 9 is a flowchart in accordance with one or more embodiments of the invention.

FIG. 9 shows a flowchart describing a method for operating an input device in accordance with one or more embodiments of the invention. Specifically, the process depicted in FIG. 9 may be used for digitally measuring changes in capacitance in the sensing region of the input device resulting from the presence of an input object. The process shown in FIG. 9 may be used by the processing system (110/210) to operate the input device (100). One or more steps shown in FIG. 9 may be omitted, repeated, and/or performed in a different order among different embodiments of the invention. Accordingly, embodiments of the invention should not be considered limited to the specific number and arrangement of steps shown in FIG. 9.

Initially in STEP 901, a transmitter signal is driven onto a transmitter electrode using the transmitter module (203). The transmitter signal may be a square wave, a sinusoidal wave, or any type of signal having sensing cycles, where each sensing cycle includes a transition between a rising portion and a falling portion.

In STEP 903, a resulting signal is received from a receiver sensor electrode of the input device. The resulting signal is received by the receiver module (205). The resulting signal comprises effects corresponding to at least one of: (i) the transmitter signal; (ii) input objects proximate to the sensing region of the input device; and (iii) one or more types of interference from a variety of sources.

In STEP 905, the DAC of the input device is set corresponding to the rising reference value. The DAC outputs an analog signal corresponding to the rising reference value.

In STEP 907, a first comparison signal is generated by a comparator of the input device for the rising portion of the sensing cycle. The comparator compares two signals and switches its output (i.e., comparison signal) to indicate which of the two signals is larger. At least one of the signals being compared is associated with the resulting signal and/or the output signal of the DAC. One of the signals being compared may be a fixed reference signal ($V_{REF}$).

In STEP 909, the rising reference value is modified based on the first comparison signal. For example, if the comparison signal from the comparator indicates that the signal associated with the resulting signal exceeds the reference value ($V_{REF}$), the rising reference value is incremented by a predetermined fixed amount. In one or more embodiments, regardless of the magnitude of the comparison signal, the rising reference value is only incremented by the same fixed amount. As another example, if the comparison signal from the comparator indicates that the signal associated with the resulting signal is less than the reference signal ($V_{REF}$), the rising reference value is decremented by a fixed amount. In one or more embodiments, regardless of the magnitude of the first comparison signal, the rising reference value is always decremented by the same fixed amount.

In STEP 911, the DAC of the input device is set corresponding to the falling reference value. The DAC outputs an analog signal corresponding to the falling reference value.

In STEP 913, a second comparison signal is generated by the comparator of the input device. As discussed above, the comparator compares two signals and switches its output (i.e., comparison signal) to indicate which of the two signals is larger. At least one of the signals being compared is associated with the resulting signal and/or the output signal of the DAC. One of the signals being compared may be a fixed reference signal ($V_{REF}$).

In STEP 915, the falling reference value is modified. For example, if the comparison signal from the comparator indicates that the signal associated with the resulting signal exceeds the reference value ($V_{REF}$), the falling reference value is incremented by a predetermined fixed amount. In one or more embodiments, regardless of the magnitude of the second comparison signal, the falling reference value is only incremented by the same fixed amount/interval. As another example, if the comparison signal from the comparator indicates that the signal associated with the resulting signal is less than the reference signal ($V_{REF}$), the falling reference value is decremented by a fixed amount. In one or more embodiments, regardless of the magnitude of the second comparison signal, the rising reference value is always decremented by the same fixed amount/interval.

In STEP 917, it is determined whether a sufficient number of sensing cycles have completed to: (i) perform meaningful statistical analyses on the behavior of the rising reference value and the falling reference value; and (ii) determine positional information for an input object in the sensing region of the input device based on the rising reference value and the falling reference value.

When a sufficient number of sensing cycles have completed, the process proceeds to STEP 919. When a sufficient number of sensing cycles have not been completed, the process proceeds to the next sensing cycle (921), and then returns to STEP 905.

In STEP 919, the presence of an input object in the sensing region is determined. As discussed above, during steady-state conditions, the rising reference value and the falling reference value each oscillate between two numbers. The initial presence of an input object in the sensing region causes the rising reference value and the falling reference value to deviate from the oscillations. Specifically, the rising reference value and the falling reference value ramp in opposite directions in response to the presence of the input object. For example, the initial presence of the input object causes the rising reference value to increase (i.e., ramps up) and the falling reference value to decrease (i.e., ramps down). The increments to the rising reference value and the decrements to the falling reference value continue until a new steady-state is reached. During this new steady-state, the input object is still present in the sensing region. Moreover, during this new steady-state, the rising reference value and the falling reference value (375) each oscillate between two new numbers. However, the difference between the rising reference value and the falling reference value is much greater than before. In one or more embodiments, an input object is deemed present in the sensing region based, at least in part, on this difference. Positional information for the input object in the sensing region is determined based on the rising reference value and the falling reference value. A flag may be issued in response to determining the presence of the input object.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A processing system for an input device, the processing system comprising:
 a transmitter module configured to drive a transmitter signal onto a transmitter electrode,
 wherein the transmitter signal comprises a plurality of sensing cycles, and
 wherein each sensing cycle of the plurality of sensing cycles comprises a rising portion and a falling portion;

a receiver module configured to receive a resulting signal with a receiver electrode, the receiver module comprising:
  a digital-to-analog converter (DAC);
  a comparator configured to:
    generate, for a rising portion of a sensing cycle of the plurality of sensing signals, a first comparison signal associated with the resulting signal and a first output signal of the DAC; and
    generate, for a falling portion of the sensing cycle, a second comparison signal associated with the resulting signal and a second output signal of the DAC;
  a feedback path operatively coupling the DAC to the comparator and configured to maintain an input node of the comparator at an approximately constant value; and
  a control module operatively coupled to the DAC and to an output of the comparator and configured to modify a rising reference value based on the first comparison signal and a falling reference value based on the second comparison signal; and
a determination module configured to determine positional information for an input object in a sensing region of the input device based on the rising reference value and the falling reference value.

2. The processing system of claim 1, wherein the control module is further configured to set an output of the DAC corresponding to the rising reference value for the rising portion and set the output the DAC corresponding to the falling reference value for the falling portion.

3. The processing system of claim 1, wherein the feedback path comprises an offset capacitor configured to modify the resulting signal.

4. The processing system of claim 1, the receiver module further comprises:
  accumulator circuitry comprising an amplifier operatively coupled to the comparator and configured to:
    accumulate a first value associated with the resulting signal during the rising portion of the sensing cycle; and
    accumulate a second value associated with the resulting signal during a second half of the sensing cycle,
  wherein the first value and the second value are inputs to the comparator, and
  wherein the accumulator circuitry comprises a reset mechanism.

5. The processing of claim 4, wherein the receiver module further comprises:
  rail detection circuitry operatively coupled to the accumulator circuitry and the control module and configured to:
    detect a railing of the amplifier,
  wherein the control module activates the reset mechanism in response to the railing of the amplifier.

6. The processing system of claim 3, wherein the feedback path further comprises a switch configured to:
  connect a lower plate of the offset capacitor to the DAC during an integration phase; and
  connect the lower plate of the offset capacitor to at least one selected from a group consisting of a first and second substantially constant voltage during a reset phase.

7. The processing system of claim 3, the receiver module further comprising:
  a coarse capacitor comprising a lower plate operatively coupled to an inversion of the transmitter signal; and
  a node inputting the resulting signal, an offset signal from the offset capacitor, and a coarse signal from the coarse capacitor.

8. The processing system of claim 1, wherein the positional information for the input object in the sensing region of the input device is determined based on a difference between rising reference value and the falling reference value.

9. The processing system of claim 1, wherein the positional information for the input object in the sensing region of the input device is determined based on a comparison between a steady-state threshold and the rising reference value and falling reference value.

10. The processing system of claim 1, wherein the determination module is configured to determine a measurement of interference based on comparison of an interference threshold with at least one of the rising reference value and the falling reference value.

11. A method for operating an input device, the method comprising:
  driving a transmitter signal onto a transmitter sensor electrode,
    wherein the transmitter signal comprises a plurality of sensing cycles, and
    wherein each sensing cycle of the plurality of sensing cycles comprises a rising portion and a falling portion;
  receiving a resulting signal with a receiver sensor electrode;
  generating, by a comparator for a rising portion of a sensing cycle of the plurality of sensing cycles, a first comparison signal associated with the resulting signal and a first output signal of a digital-to-analog converter (DAC),
    wherein the comparator is operatively connected to the DAC by a feedback path configured to maintain an input node of the comparator at an approximately constant value;
  generating, for the falling portion of the sensing cycle, a second comparison signal associated with the resulting signal and a second output signal of the DAC;
  modifying a rising reference value based on the first comparison signal;
  modifying a falling reference value based on the second comparison signal; and
  determining positional information for an input object in a sensing region of the input device based on the rising reference value and the falling reference value.

12. The method of claim 11, further comprising:
  setting, for the rising portion of the sensing cycle, an output of the DAC corresponding to the rising reference value; and
  setting, for the falling portion of the sensing cycle, the output of the DAC corresponding to the falling reference value.

13. The method of claim 11, wherein modifying the rising reference value comprises:
  incrementing the rising reference value by a fixed interval.

14. The method of claim 11, wherein determining positional information comprises:
  calculating a difference between the rising reference value and the falling reference value.

15. The method of claim 11, further comprising:
  generating an inverted version of the transmitter signal; and
  driving a coarse capacitor with the inverted version,
  wherein the coarse capacitor is operatively coupled to a node inputting the resulting signal.

16. The method of claim 11, further comprising:
discharging a coarse capacitor associated with a node inputting the resulting signal;
connecting a first end of the coarse capacitor to a common capacitance node; and
transitioning a second end of the coarse capacitor from VDD to GND to increase the capacitance of the coarse capacitor.

17. An input device comprising:
a plurality of transmitter electrodes;
a plurality of receiver electrodes; and
a processing system, the processing system coupled to the plurality of transmitter electrodes and the plurality of receiver electrodes, the processing system is configured to:
  drive a transmitter signal onto at least one of the plurality of transmitter electrodes,
  wherein the transmitter signal comprises a plurality of sensing cycles, and
  wherein each sensing cycle of the plurality of sensing cycles comprises a rising portion and a falling portion;
  receive a resulting signal with the plurality of receiver sensor electrodes;
  generate, by a comparator for a rising portion of a sensing cycle, a first comparison signal associated with the resulting signal and a first output signal of a digital-to-analog converter (DAC),
  wherein the comparator is operatively connected to the DAC by a feedback path configured to maintain an input node of the comparator at an approximately constant value;
  generate, for a falling portion of the sensing cycle, a second comparison signal associated with the resulting signal and a second output signal of the DAC;
  modify a rising reference value based on the first comparison signal;
  modify a falling reference value based on the second comparison signal; and
  determine positional information for an input object in a sensing region of the input device based on the rising reference value and the falling reference value.

18. The input device of claim 17, wherein the processing system is further configured to set an output of the DAC corresponding to the rising reference value for the rising portion and set the output the DAC corresponding to the falling reference value for the falling portion.

19. The input device of claim 17, wherein the feedback path comprises an offset capacitor configured to modify the resulting signal.

20. The input device of claim 17, wherein the positional information for the input object in the sensing region of the input device is determined based on a difference between rising reference value and the falling reference value.

* * * * *